United States Patent [19]
Partin et al.

[11] Patent Number: 5,184,106
[45] Date of Patent: Feb. 2, 1993

[54] MAGNETIC FIELD SENSOR WITH IMPROVED ELECTRON MOBILITY

[75] Inventors: Dale L. Partin, Romeo; Joseph P. Heremans, Troy, both of Mich.

[73] Assignee: General Motors Corporation, Detroit, Mich.

[21] Appl. No.: 646,893

[22] Filed: Jan. 28, 1991

[51] Int. Cl.$^5$ .......................................... H01L 43/00
[52] U.S. Cl. ................................................ 338/32 R
[58] Field of Search .............. 338/32 R, 32 H; 357/27

[56] References Cited

U.S. PATENT DOCUMENTS

| | | | |
|---|---|---|---|
| 3,617,975 | 11/1971 | Wieder | 338/32 |
| 4,251,795 | 2/1981 | Shibasaki et al. | 338/32 R |
| 4,401,966 | 8/1983 | Ohmura et al. | 338/32 R |
| 4,568,905 | 2/1986 | Suzuki et al. | 338/32 R |
| 4,926,154 | 5/1990 | Heremans et al. | 338/32 R |
| 4,939,456 | 7/1990 | Morelli et al. | 324/207.21 |
| 4,978,938 | 12/1990 | Partin et al. | 338/32 R |

OTHER PUBLICATIONS

S. Kataoka, "Recent Development of Magnetoresistive Devices and Applications," *Circulars of the Electrotechnical Laboratory No.* 182, Agency of Industrial Science and Technology, Tokyo (Dec. 1974).

H. H. Wieder, "Transport coefficients of Indium Arsenide epilayers," *Applied Physics Letters*, vol. 25, No. 4, pp. 206–208 (15 Aug. 1974).

G. Burns, *Solid State Physics Sections 18-5 and 18-6*, pp. 726–747, Academic Press, Inc., Harcourt Brace Jovanovich, Publishers, New York, 1985.

H. P. Baltes and R. S. Popovic, "Integrated Semiconductor Magnetic Field Sensors," *Proceedings of the IEEE*, vol. 74, No. 8, pp. 1107–1132 (Aug. 1986).

S. Kalem, J.-I. Chyi and H. Morkoc, "Growth and transport properties of InAs epilayers on GaAs," *Applied Physics Letters*, vol. 53, No. 17, pp. 1647–1649 (24 Oct. 1988).

H. Reisinger, et al., "Magnetoconductance study of accumulation layers on n-InAs," *Physical Review B*, The American Physical Society, vol. 24, No. 10, pp. 5960–5969, 15 Nov. 1981.

R. J. Wagner et al., "Magneto-Transconductance Study of Surface Accumulation Layers in InAs," *Surface Science* 73, North-Holland Publishing Company, pp. 545–546, 1978.

R. J. Wagner et al., "Magneto-Transconductance Study of Surface Accumulation Layers in InAs," Physics of Narrow Gap Semiconductors, Proceedings of the III International Conference, Sep. 12–15, 1977, PWN—Polish Scientific Publishers, pp. 427–432.

L. D. Zhu, et al., "Two-dimensional electron gas in $In_{0.53}Ga_{0.47}As/InP$ heterojunctions grown by atmo-

(List continued on next page.)

*Primary Examiner*—Marvin M. Lateef
*Attorney, Agent, or Firm*—Robert J. Wallace

[57] ABSTRACT

A magnetic field sensor, such as a magnetoresistor, having improved electron mobility comprises a substrate of an insulating semiconductor material, such as gallium arsenide or indium phosphide, having on a surface thereof a narrow strip of a thin active film. The active film has a thin first layer of undoped or lightly doped high electron mobility semiconductor material, such as indium antimonide or indium arsenide, on the substrate surface, and a second layer of the semiconductor material, which may be thicker than the first layer, on the first layer. The second layer is at least partially doped n-type conductivity so as to have a high electron density. The second layer may be entirely of the n-type conductivity semiconductor material or a superlattice of alternating layers of n-type conductivity and intrinsic semiconductor materials or a superlattice of intrinsic semiconductor material and a ternary or quaternary alloy of the semiconductor material which is at least partially of n-type conductivity. A conductive contact is on the active film at the ends thereof. For a magnetoresistor, a plurality of conductive shorting bars are on and spaced along the strip of the active film material.

45 Claims, 6 Drawing Sheets

OTHER PUBLICATIONS spheric pressure metalorganic chemical-vapor deposition", *J. Appl. Phys.*, 58(8), pp. 3145-3149, 15 Oct. 1985.

D. C. Tsui, "Observation of Surface Bound State and Two-Dimensional Energy Band by Electron Tunneling," *Physical Review Letters*, vol. 24, No. 7, pp. 303-306, 16 Feb. 1970.

D. C. Tsui, "Electron-Tunneling Studies of a Quantized Surface Accumulation Layer," *Physical Review B*, vol. 4, No. 12, pp. 4438-4449, 15 Dec. 1971.

D. C. Tsui, "Landau-level spectra of conduction electrons at an InAs surface," *Physical Review B*, vol. 12, No. 12, pp. 5739-5748, 15 Dec. 1975.

T. C. Harman, et al., "Electrical Properties of n-Type InAs," *Physical Review*, vol. 104, No. 6, pp. 1562-1564, Dec. 15, 1956.

R. F. Wick, "Solution of the Field Problem of the Germanium Gyrator," *Journal of Applied Physics*, vol. 25, No. 6, pp. 741-756, Jun., 1954.

H. H. Wieder, "Anomalous Transverse Magnetoresistance of InSb Films", *Journal of Applied Physics*, vol. 40, No. 8, pp. 3320-3325 (Jul. 1969).

MAGNETIC FIELD SENSOR WITH IMPROVED ELECTRON MOBILITY

FIELD OF THE INVENTION

The present invention relates to a thin film magnetic field sensor having improved electron mobility and, more particularly, to a thin film magnetoresistor or similar magnetic field sensor of a high electron mobility material, such as indium antimonide, having improved electron mobility.

BACKGROUND OF THE INVENTION

Magnetoresistors are devices whose resistance varies with a magnetic field applied to the device, and are therefore useful as magnetic field sensors. The magnetoresistor is useful for position sensing applications and may be useful for a variety of other applications, such as brushless motors or magnetic memory storage devices. Initially, magnetoresistors were believed to be best formed from high carrier mobility semiconductor materials in order to obtain the highest magnetic sensitivity. Therefore, the focus was on making magnetoresistors from bulk materials that were thinned down or films having sufficient thickness to exhibit a high average mobility. The use of bulk materials that were thinned down has the disadvantage that the process of thinning the body of the material results in defects in the surface of the body which adversely affects the operating characteristics of the body, such as lowering the electron mobility. Also, this process is relatively time-consuming and expensive to carry out. Forming the magnetoresistor of a thick film or substrate creates problems with the resistance of the film. Very large currents are needed to obtain a significant voltage drop across the device, and large amounts of power are then dissipated in the device.

Figure 1:
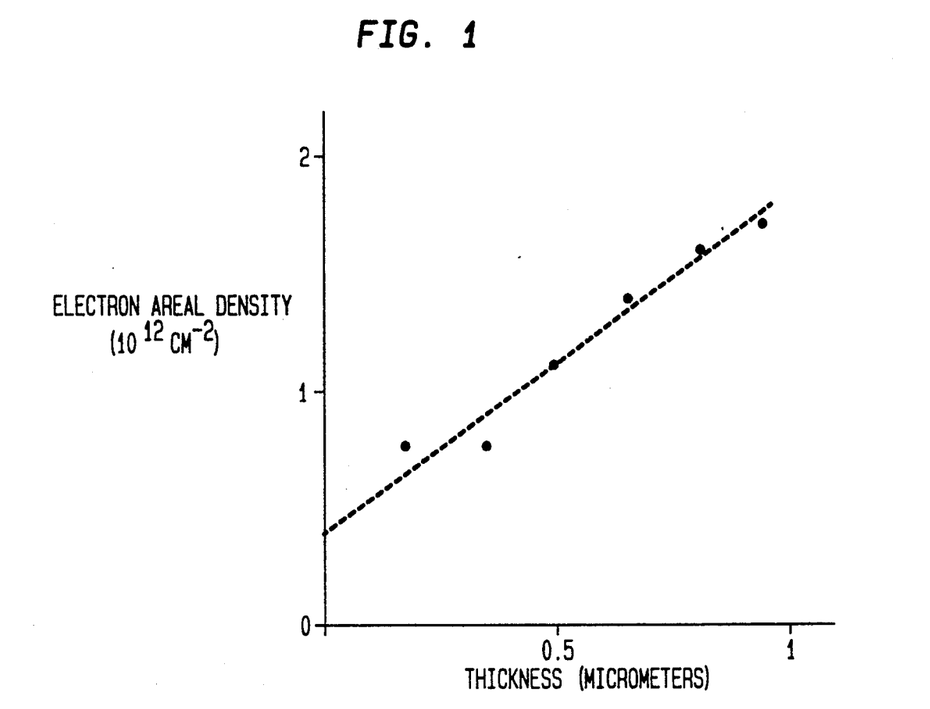
FIG. 1 is a graph showing the electron areal density vs. the thickness of a film of indium antimonide on a gallium arsenide substrate.
Figure 2:
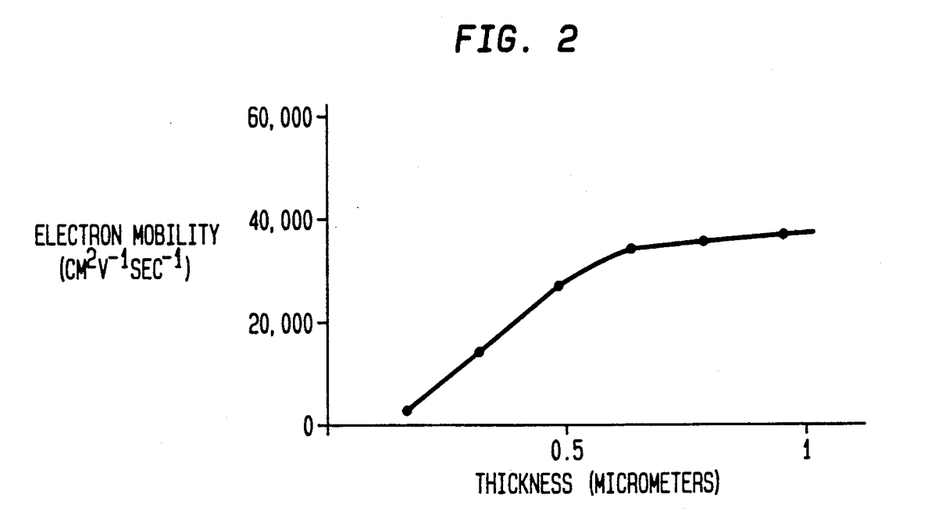
FIG. 2 is a graph showing the electron mobility vs. the thickness of the film of indium antimonide on the gallium arsenide substrate.

In order to remove the problem of thick film magnetoresistors, attempts have been made to form the magnetoresistor from a thin film. However, the problems which arise from thin films of a magnetoresistor material on a substrate are illustrated in FIGS. 1 and 2. FIG. 1 shows the electron areal density vs. thickness of a film, and FIG. 2 shows the electron mobility vs. thickness of the same film. The film used was of indium antimonide (InSb) epitaxially deposited on a substrate of gallium arsenide (GaAs) to a thickness of one micrometer. To obtain the data for these graphs, the film was etched in a solution of by volume 1 part HNO₃ and 8 parts lactic acid in several steps. After each etching step the measurements were made with Hall effect measurements. The zero thickness of the film is the interface of the indium antimonide film with the substrate. FIG. 1 shows that the areal carrier density for the material does not have an intercept at zero for zero thickness. This implies that the carrier density is not homogeneous in the film, and that the carrier density is higher near the interface of the film and the substrate and/or at the surface of the film. Many of these excess electrons probably are at the interface of the film and the substrate since crystallographic defects are known to induce electrons in indium antimonide. Secondly, FIG. 2 shows that the electron mobility is very poor near the interface of the film and the substrate. To the extent that the excess electron density is in the poor mobility region near the substrate, the average electron mobility in the film is reduced. Since the sensitivity of magnetoresistors to magnetic field depends on the second power of carrier mobility, the sensitivity of these devices is reduced by lower mobilities.

We believe that lower carrier mobilities near the interface of the film and the substrate are caused in large measure by the large crystalline lattice constant mismatch between high electron mobility materials, such as indium antimonide, and suitable substrate materials, such as gallium arsenide, which is about 14%. For practical purposes, this is difficult to eliminate since there are not many materials commercially available which can be used for the substrate of this device. Therefore, it is desirable to be able to modify the film used for the active layer of a magnetoresistor or other similar magnetic field sensor to improve the carrier mobility of the device.

SUMMARY OF THE INVENTION

The present invention relates to a magnetic field sensor comprising a thin active layer on the surface of a substrate. The active layer comprises a first layer directly on the substrate of a substantially intrinsic high electron mobility semiconductor material, and a second layer which may be thicker than the first layer containing the semiconductor material or an alloy thereof which is at least partially of n-type conductivity. The first layer contains most of the defects resulting from lattice mismatch between the materials of the first layer and the substrate and has low carrier density and low electron mobility. The second layer contains better quality semiconductor material and has higher carrier density and higher electron mobility so as to improve the mobility of the device.

More particularly, the present invention relates to a magnetic field sensor comprising a substrate having a surface and a thin active film of a high electron mobility semiconductor material on the surface of the substrate. The active film comprises a first layer of the semiconductor material or an alloy thereof which is undoped or lightly doped and a second layer thicker than the first layer of the semiconductor material thereof having at least portions thereof of highly doped n-type conductivity. The second layer may be entirely of n-type doped semiconductor material or a superlattice of alternating layers of n-type and intrinsic semiconductor material.

The invention will be better understood from the following more detailed description taken with the accompanying drawings.

BRIEF DESCRIPTION OF THE DRAWINGS

It should be understood that the drawings are not necessarily drawn to scale.

DETAILED DESCRIPTION

Figure 3:
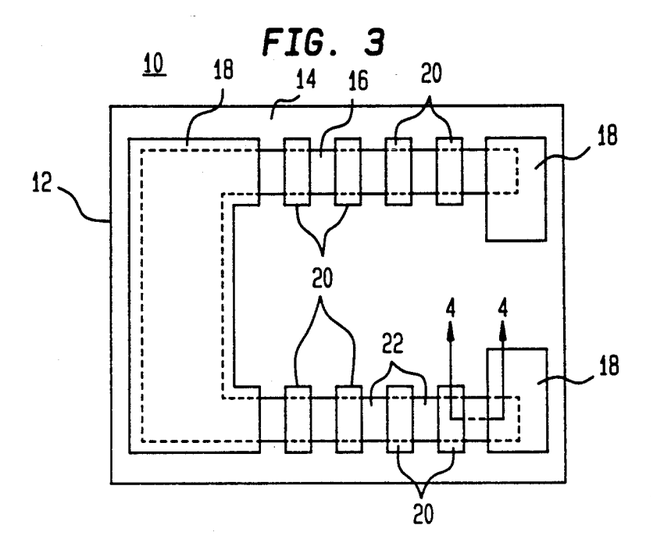
FIG. 3 is a top plan view of a magnetoresistor in accordance with the present invention.
Figure 4:
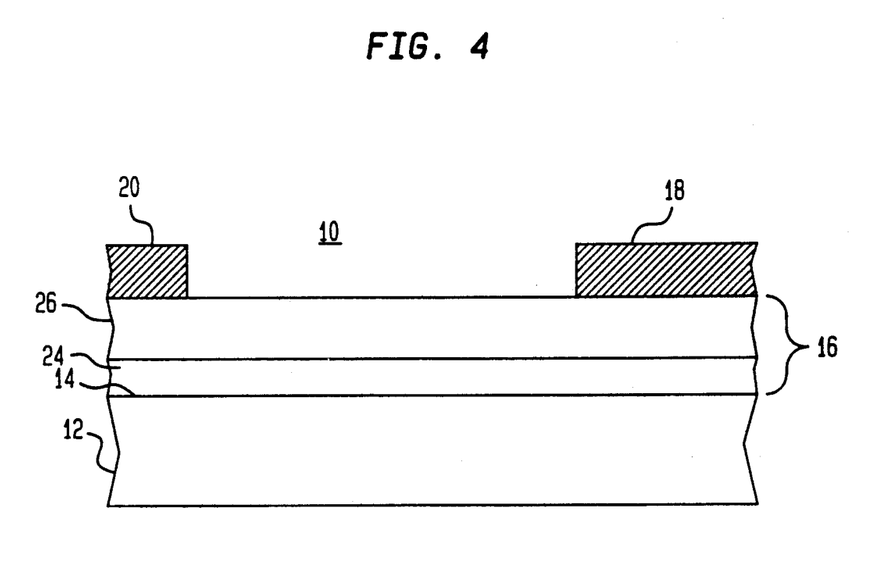
FIG. 4 is a sectional view taken along line 4—4 of FIG. 3.

Referring to FIGS. 3 and 4, there is shown a top plan view and a sectional view, respectively, of a magnetoresistor 10 in accordance with the present invention. Magnetoresistor 10 comprises a substrate 12 having a surface 14, and a magnetoresistor film 16 on the substrate surface 14. As shown in FIG. 3, the magnetoresistor film 16 is relatively narrow and extends in a U-shape path. However, the magnetoresistor film 16 can be straight or extend in any desired meandering pattern depending on the length of the film desired. At the ends of the magnetoresistor film 16 are terminal contacts 18 which have a low resistance contact with the magnetoresistor film 16. A plurality of conductive shorting bars 20 are on the magnetoresistor film 16 and are spaced therealong. The shorting bars 20 also make low resistance contact with the magnetoresistor film 16 and divide the magnetoresistor film 16 into a plurality of active regions 22 as described in U.S. Pat. No. 4,926,154 to J. P. Heremans et al., issued May 15, 1990 and entitled, "Indium Arsenide Magnetoresistor."

The substrate 12 is of an insulating material which is readily available as a solid body and on which the material of the magnetoresistor film 16 can be readily epitaxially deposited. Undoped gallium arsenide (GaAs) or indium phosphide (InP) have been found suitable for this purpose.

The magnetoresistor film 16 comprises a first layer 24 of undoped or lightly doped n-type or p-type conductivity doped high mobility semiconductor material on the substrate surface 14, and a second layer 26 of n-type conductivity semiconductor material. The first and second layers 26 are preferably of a group III-V semiconductor material, such as indium antimonide (InSb), indium arsenide (InAs) and/or alloys thereof, such as indium aluminum antimonide ($In_{1-x}Al_xSb$), indium phosphide antimonide ($InP_xSb_{1-x}$) and indium aluminum arsenide ($In_{1-x}Al_xAs$). Near lattice matched quaternary alloys, such as indium aluminum antimonide bismuthide ($In_{1-x}Al_xSb_{1-y}Bi_y$) or indium phosphide bismuthide antimonide ($InP_xBi_ySb_{1-x-y}$) may be used for the first layer 24 with indium antimonide for the second layer 26. Also, indium aluminum arsenide antimonide ($In_{1-x}Al_xAs_{1-y}Sb_y$) can be used for the first layer 24 with indium arsenide for the second layer 26. Alternatively, gallium may be substituted for aluminum in these ternary and quaternary alloys. In all cases, the object is to increase the energy band gap of the alloy in the first layer 24 relative to the indium antimonide or indium arsenide in the second layer 26, making it easier to obtain low carrier densities in the first layer 24. Incorporation of deep impurity species during the growth of the first layer 24, such as oxygen or certain metals (e.g., iron) may be used to further decrease the carrier density in the first layer 24. However, it is important to minimize lattice mismatch between the first and second layers 24 and 26, since a significant mismatch will cause defects, such as dislocations, to form in the second layer 26 which will degrade electron mobility. This is more difficult for indium antimonide, since the only lattice matched alloys available involve bismuth, which has a very low solubility in indium antimonide. Hence, there is a trade-off, since adding more aluminum or gallium to indium antimonide in the first layer 24 increases the energy band gap more, but also increases the lattice mismatch more. For the simpler case in which the first and second layers 24 and 26 are both made from indium antimonide (undoped and doped n-type, respectively), it is desirable that the second layer 26 be thicker than the first layer. However, this is not necessarily the case if the first layer 24 is made from a high energy band gap alloy. Making the second layer 26 relatively thin then becomes feasible and desirable to make the device impedance high and the power dissipation low.

The combined thickness of the two layers 24 and 26 forming the magnetoresistor film 16 is no greater than about 5 micrometers, and preferably between 1.5 and 3 micrometers. As stated above, when the first and second layers 24 and 26 are both of indium antimonide, the first layer 24 is preferably much thinner than the second layer 26 and is of a thickness no greater than about 1 micrometer and preferably between 0.2 and 0.4 micrometers. The first and second layers 24 and 26 are epitaxially deposited on the substrate 12 in succession using any well-known epitaxial deposition process for group III-V semiconductor materials, such as vapor phase epitaxy (VPE), liquid phase epitaxy (LPE), metal organic chemical vapor deposition (MOCVD) or molecular beam epitaxy (MBE).

Since the first layer 24 is deposited directly on the substrate surface 14, the great majority of the crystallographic defects resulting from the difference in the lattice constants of the materials of the first layer 24 and the substrate will be in the first layer. However, by having the first layer 24 undoped or only slightly doped, it will have a high resistance and low electron density. Therefore, the first layer 24 will be electrically inactive. However, since the second layer 26 is deposited on a layer, the first layer 24, of the same material, it will be of good crystalline quality and have high carrier mobility. Also, the second layer is doped n-type so as to have a high electron density. Thus, the second layer 26 has a higher average carrier mobility and serves as the active portion of the magnetoresistor film 16. In addition, increasing the electron density with a donor, the n-type conductivity impurity, has the additional benefit of stabilizing the device resistance as a function of temperature. This is because, with the small energy band gap of indium antimonide, electrons are thermally excited to the conduction band as the temperature increases. As the density of these thermally excited electrons exceeds that of those introduced by donors, the device resistance decreases rapidly with increasing temperature. Thus, below this transition temperature, the device resistance is stabilized by doping the film. However, the donor ions introduced into the second layer 26 tend to scatter electrons, thus reducing their mobility. Thus, there is a trade-off, with optimum electron concentrations being obtained by doping impurity concentrations typically in the range of $2 \times 10^{16}$ impurities/$cm^3$ to $3 \times 10^{17}$ impurities/$cm^3$, and more preferably in the range of $5 \times 10^{16}$ impurities/$cm^3$ to $2 \times 10^{17}$ impurities/$cm^3$. Suitable n-type conductivity doping impurities are silicon, germanium, tin, sulfur, selenium and tellurium, with tin or tellurium being preferred for indium antimonide and silicon for indium arsenide.

The contacts 18 and shorting bars 20 are of an electrically conductive material which has a low contact resistance with the semiconductor material of the second layer 26 of the magnetoresistor film 16 and a low sheet resistance. Metals, such as gold, silver, copper, aluminum, titanium, nickel chromium alloy, gold germanium alloy, platinum and palladium are suitable for this purpose. Multi-layered combinations of these materials are preferable, such as a layer of a gold germanium alloy in contact with the surface of indium antimonide followed by a layer of nickel and finally a layer of gold. The contacts 18 and shorting bars 20 can be formed of a third, very thin (e.g., 500 Angstroms) epitaxial layer of the same material as the second layer 26 of the magnetoresistor film 16, such as indium antimonide, which is doped n-type conductivity to a concentration greater than that in the second layer. Contact metals of the type described above are then deposited on the third layer.

The magnetoresistor 10 can be made by first epitaxially depositing on the substrate surface 14 the undoped first layer 24 followed by the epitaxial deposition of the doped second layer 26. As stated above, the layers 24 and 26 can be deposited by any well-known epitaxial deposition technique for group III-V materials, such as MOCVD or MBE. The second layer 26 is preferably doped with the n-type conductivity impurity during the deposition process. However, the second layer 26 can be deposited undoped and then doped after deposition by ion implantation or diffusion. After the second layer 26 is deposited, a masking layer, such as of a photoresist, is formed over the portion of the second layer 26 which is to form the narrow strip of the magnetoresistor film 16, and the uncovered portion of the two layers 24 and 26 are etched away, such as with a suitable chemical etchant. A masking layer of a photoresist is then formed over the second layer 26 and over the surface exposed by the previous etching step. This masking layer is patterned to have openings where the contacts 18 and shorting bars 20 are desired.

A layer of the metal of the contacts 18 and shorting bars 20 is then deposited on the masking layer and the surface areas of the second layer 26 exposed by the masking layer using any suitable deposition process for the metal, such as evaporation in a vacuum or vacuum sputtering. The photoresist masking layer is then dissolved chemically, lifting off the metal layer everywhere except where the contacts 18 and shorting bars 20 are desired. The contacts are then thermally annealed to improve contact resistance. If the contacts 18 and shorting bars 20 are to be formed of a third layer of a semiconductor material coated with a metal, after the second layer 26 is epitaxially deposited, a layer of the semiconductor material of the contacts 18 and shorting bars 20 is epitaxially deposited on the second layer 26. The additional semiconductor material layer is etched along with the first and second layers 24 and 26 to form the narrow strip of the magnetoresistor film 16. The metal contacts for the third contact layer and the shorting bars are then formed by the "lift-off" technique previously described. If the third layer of semiconductor material is adequately thin (e.g., 200-500 Angstroms) and not too heavily doped (e.g., not above about $10^{18}$ impurities/cm$^3$), then it is unnecessary to chemically etch away this third semiconductor layer between the metal contacts 18 and shorting bars 20. Otherwise, this material is etched in these regions using a suitable chemical etchant and with the metal contacts 18 and shorting bars 20 serving as a masking material.

Figure 8:
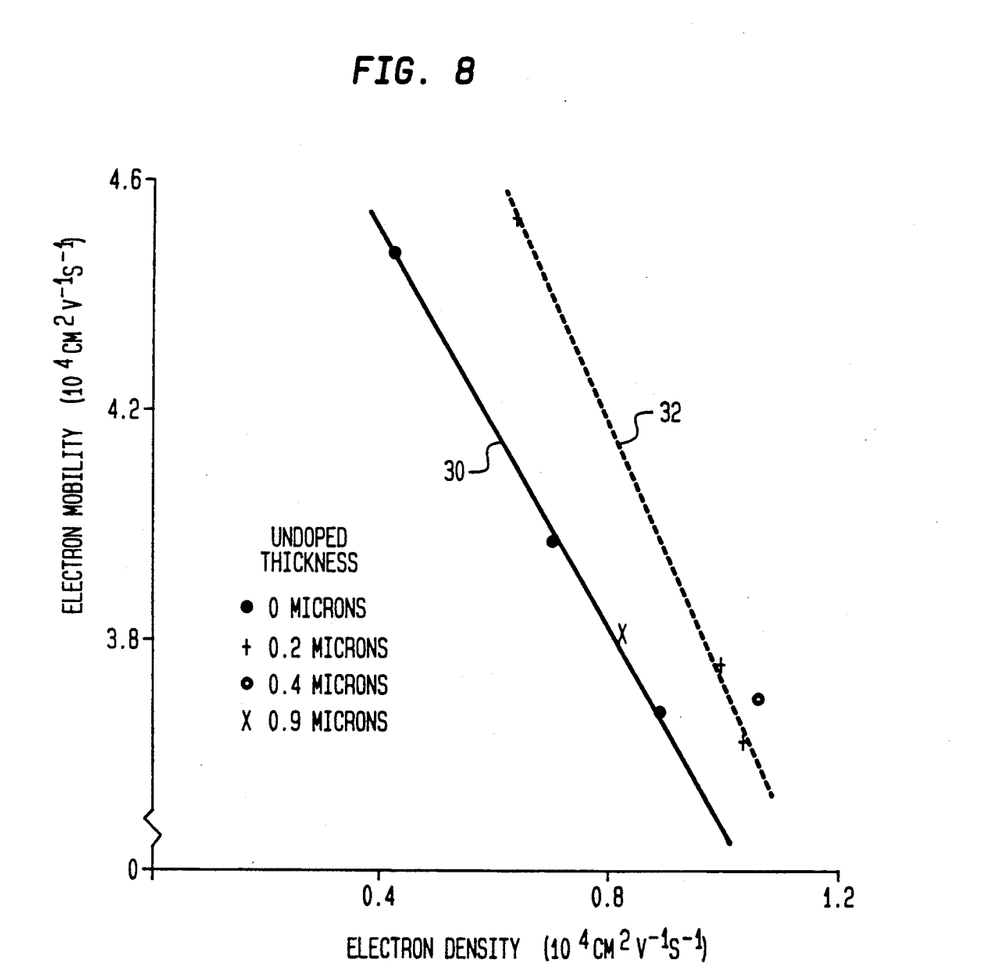
FIG. 8 is a graph of electron mobility vs. electron density of various magnetoresistors made in accordance with the present invention.

Referring now to FIG. 8, there is shown a graph with electron mobility on the y-axis versus average electron density on the x-axis for prior art magnetoresistors and for magnetoresistors made in accordance with the present invention. As is described hereinbelow for Example I, prior art magnetoresistors are formed of a layer of magnetoresistive material which is doped completely through and therefore it has a zero undoped thickness. The solid line curve 30 of FIG. 8 is derived from prior art magnetoresistors. As is described hereinbelow for Examples II and III, magnetoresistors in accordance with the present invention are formed of magnetoresistive material having an undoped portion (thickness) with a doped portion (thickness) thereover. The dashed line 32 curve of FIG. 8 is derived from magnetoresistors of Example II in accordance with the present invention in which the undoped thickness is 0.2 microns (micrometers). For Example III, the single point indicated by the "o" is a magnetoresistor having an undoped thickness of 0.4 microns and the point indicated by the "X" is a magnetoresistor having an undoped thickness of 0.9 microns. In all cases shown in FIG. 8, the total thickness (undoped and doped) was 2.0 microns and the average electron density shown on the x-axis is the overall average including the undoped and doped layers.

EXAMPLE I

Several magnetoresistors were made by depositing a layer of tellurium doped indium antimonide on the surface of a substrate of indium phosphide. The indium antimonide layer was epitaxially deposited by molecular beam epitaxy using lead telluride as the source for the tellurium. The thickness of the indium antimonide film was about 2 microns (micrometers) and a different tellurium atom density was used in different ones of the magnetoresistors. After the indium antimonide film was deposited for each magnetoresistor, the average electron density and electron mobility for each film was measured. In FIG. 8, the solid line 30 having the solid dots therealong shows the results of these measurements.

EXAMPLE II

Several magnetoresistors were made in the manner described in Example I except that the initial 0.2 micrometers of the indium antimonide film deposited on the substrate was intentionally undoped. The remaining portion of the films, deposited to a thickness of 1.8 micrometers for a total thickness of 2 micrometers, was doped with tellurium. The tellurium atom density was different in each magnetoresistor. The average electron density and electron mobility of the films was measured and these measurements are shown in FIG. 8 by the dash line 32 having + therealong.

EXAMPLE III

Two magnetoresistors were made in the manner described in Example II except that for one of the magnetoresistors, the first 0.4 micrometers of the deposited indium antimonide film was intentionally undoped, and for the other the first 0.9 microns was intentionally undoped. For both of the magnetoresistors, the total thickness of the undoped portion of the film and the tellurium doped portion was 2 microns. The average electron density and electron mobility of the films of both of the magnetoresistors was measured. In FIG. 8, the measurements for the film having the first 0.4 microns undoped is indicated by the o and for the film having the first 0.9 microns undoped by the x.

From FIG. 8, it can be seen that for any particular doping density, which determines the electron density, the electron mobility in the films having an initial undoped portion is higher than for the film which is doped completely through its thickness. Since the sensitivity of a magnetoresistor resistance to magnetic field is a function of the electron mobility squared, the improvement in electron mobility obtained by the magnetoresistors of the present invention provides an improved magnetoresistor sensitivity.

Figure 5:
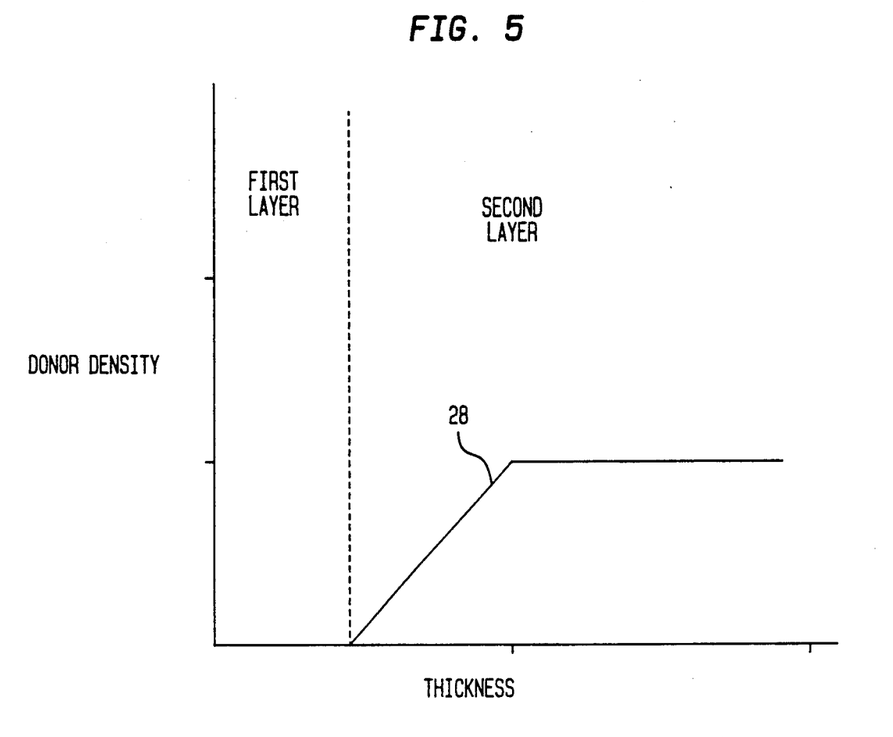
FIG. 5 is a chart showing the donor density vs. thickness of film of a variation of the magnetoresistor shown in FIGS. 3 and 4.

Referring now to FIG. 5, there is shown a graph of donor density on the y-axis versus thickness on the x-axis for the magnetoresistor layer 16 of FIGS. 3 and 4. Although the second layer 26 of the magnetoresistor film 16 has been described as being uniformly doped with the n-type conductivity impurity, this is not necessarily the case. Since, as shown in FIG. 2, the mobility continues to improve somewhat with increasing thickness of the active layer, the device sensitivity and thermal stability may be optimized by grading the donor impurity density up to a constant value. This can be easily seen in FIG. 5. The doping density in the second layer 26, indicated by the line 28, increases from zero at the interface of the first and second layers 24 and 26 to a maximum partially through the thickness of the second layer 26 and then remains constant across the remaining portion of the second layer 26. The gradient of doping may vary depending on the specific application, as well as upon the details of crystal quality vs. thickness, which is dependent upon growth techniques.

Figure 6:
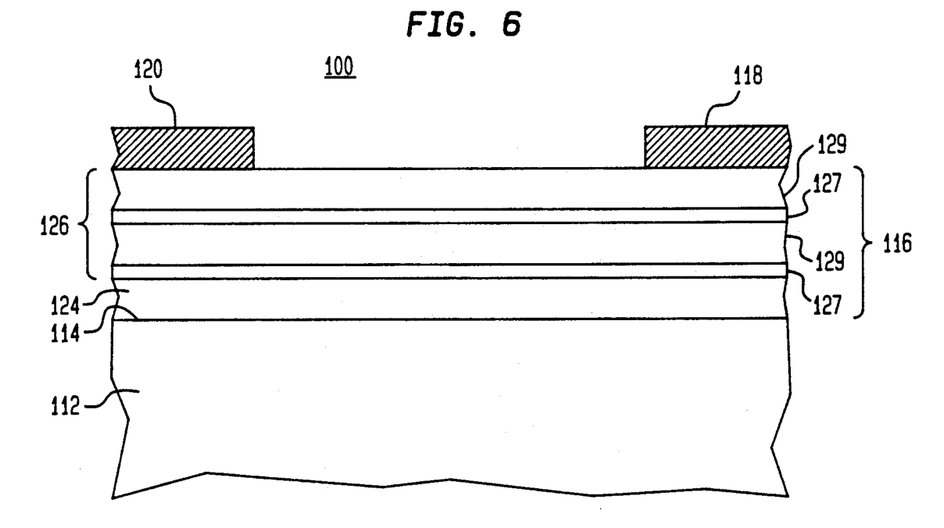
FIG. 6 is a sectional view of a portion of another magnetoresistor in accordance with the present invention.

Referring to FIG. 6, there is shown a sectional view of a portion of another magnetoresistor 100 in accordance with the present invention. The magnetoresistor 100 comprises a substrate 112 of an insulating material, such as gallium arsenide or indium phosphide, having a surface 114. On the substrate surface 114 is a magnetoresistor film 116. The magnetoresistor film 116 comprises a first layer 124 of undoped or only slightly doped indium antimonide. A second layer 126 is on the first layer 124. The second layer 126 is a superlattice layer formed of a plurality of alternating layers 127 and 129 of n-type conductivity indium antimonide and intrinsic (undoped) indium antimonide, respectively. The n-type conductivity indium antimonide layers 127 are doped to a concentration of $3 \times 10^{17}$ to $5 \times 10^{18}$ impurities/cm$^3$ and are each of a thickness of 10 to 100 Angstroms. The intrinsic antimonide layers 129 are each of a thickness of 300 to 2000 Angstroms. The total number of the layers 127 and 129 depends on the thickness of the second layer 126. As in the magnetoresistor 10, the total thickness of the magnetoresistor film 116 is no greater than about 5 micrometers and preferably between 1.5 and 3 micrometers. The first layer 124 is of a thickness of no greater than 1 micrometer and preferably between 0.2 and 0.4 micrometer. Contacts 118 and shorting bars 120 are on the second layer 126 as in the magnetoresistor 10. The superlattice second layer 126 should provide some improvement in electron mobility for a given average electron density as a result of some separation of electrons from donor ions, although electrostatic attraction between positive donor ions and electrons will limit this separation.

Figure 7:
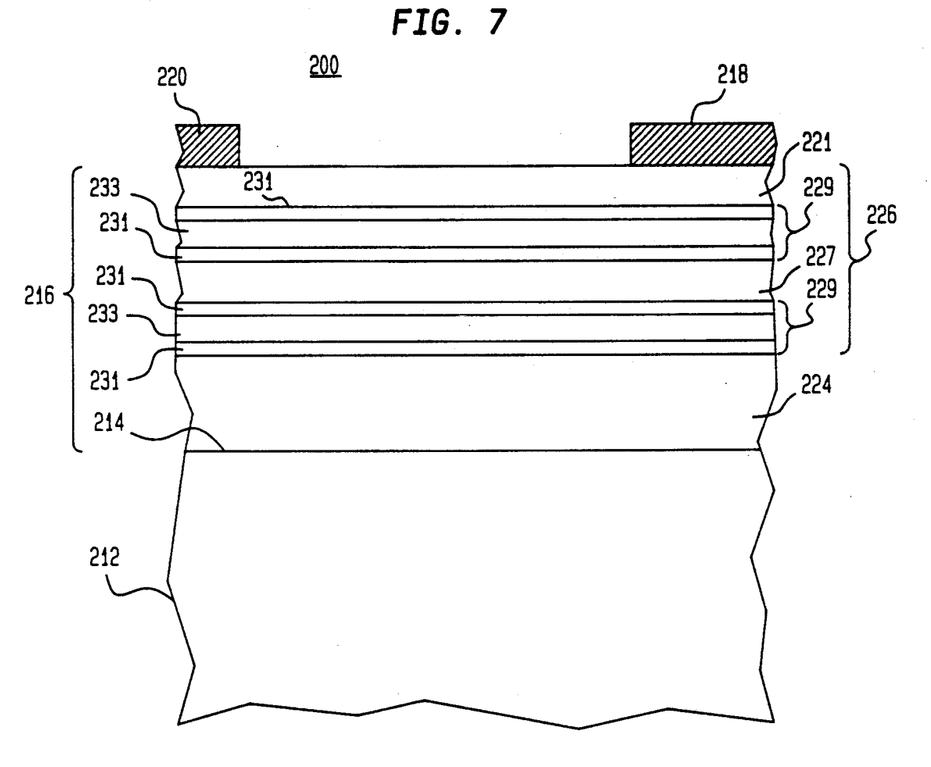
FIG. 7 is a sectional view of a portion of still another magnetoresistor in accordance with the present invention.

Referring to FIG. 7, there is shown a sectional view of a portion of still another magnetoresistor 200 in accordance with the present invention. Magnetoresistor 200 comprises a substrate 212 of an insulating material, such as gallium arsenide or indium phosphide, having a surface 214. A magnetoresistor film 216 is on the substrate surface 214. The magnetoresistor film 216 comprises a first layer 224 of undoped or only slightly doped high energy gap alloy of indium antimonide on the substrate surface 214. On the first layer 224 is a second layer 226, which is a compositional superlattice layer formed of alternating layers 227 and 229 of indium antimonide and a high energy gap ternary or quaternary alloy of indium antimonide, such as indium aluminum antimonide (In$_{1-x}$Al$_x$Sb) or indium phosphide antimonide (InP$_x$Sb$_{1-x}$). Since these two ternary alloys have a smaller lattice constant than indium antimonide, the useful range of x is limited to x being no greater than 0.2. The indium antimonide layers 227 of the second layer 226 are undoped. However, each of the ternary alloy layers 229 of the second layer 226 are in themselves superlattice layers formed of alternating layers 231 and 233 of intrinsic ternary alloy and n-type conductivity ternary alloy, respectively. The intrinsic ternary alloy layers 231 are of a thickness of about 30 Angstroms and the n-type ternary alloy layers 233 are of a thickness of about 50 Angstroms and are doped to a concentration of between $2 \times 10^{17}$ impurities/cm$^3$ to $5 \times 10^{18}$ impurities/cm$^3$. The undoped indium antimonide layers 227 are of a thickness of about 300 to 2000 Angstroms. Contacts 218 and shorting bars 220 are on the magnetoresistor layer 216 as in the magnetoresistor 10. On the outermost layer 229 is an indium antimonide layer 221 which may be undoped or doped n-type. This layer may be etched away between the contacts 218 and shorting bars 220 if it is of a large enough thickness and high enough electron density to appreciably increase the lateral conductivity of the magnetoresistor film 216. In this case, a suitable chemical etchant is used with the contacts 218 and shorting bars 220 serving as etching masks. In the magnetoresistor 200, the combination of compositional as well as doping superlattice in the second layer 226 may alleviate the problem of electrostatic attraction between positive donor ions and electrons by using the conduction band discontinuity in the heterojunction system provided by the ternary alloy to separate the electrons in the indium antimonide from the donor ions in the higher energy band gap ternary alloy.

Although the magnetic field sensor of the present invention has been described as a magnetoresistor, it can be used for other types of sensors.

Figure 9:
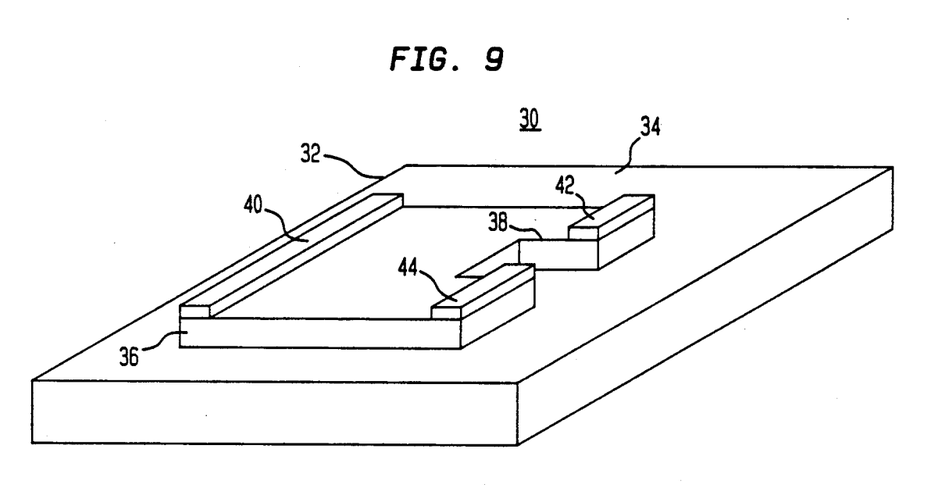
FIG. 9 is a perspective view of a gateless split-drain MAGFET in accordance with the present invention.

Referring now to FIG. 9, there is shown a perspective view of a gateless split-drain magnetic field-effect transistor (MAGFET) 30. The MAGFET 30 comprises a substrate 32 of an insulating material having on a surface 34 thereof an active film 36 of a magnetic field sensitive semiconductor material of the same construction as the magnetoresistor film 16 of the magnetoresistor 10 shown in FIGS. 3 and 4. As previously described, the active film comprises a first layer of undoped or lightly doped n-type or p-type conductivity semiconductor material and a second layer of n-type conductivity semiconductor material. mThe active film 36 is shown as being rectangular having a notch 38 therein along one side thereof. A source contact 40 of a conductive material is on the active film 36 along its side opposite the side having the notch 38 therein. First and second drain contacts 42 and 44 of a conductive material are on the active film 36 along its side having the notch 38 therein and at opposite sides of the notch 38.

In the operation of the MAGFET 30, current flows from the source contact 40 across the active film 36 to the first and second drain contacts 42 and 44. A magnetic field applied perpendicularly to the top surface of the device deflects current carrying electrons to one side of the device, so that more current flows from one drain than from the other. Thus, the magnetic field is sensed in a differential mode, allowing the polarity of the magnetic field to be determined.

Thus, there is provided by the present invention a magnetoresistor in which the magnetoresistor film comprises a first thin layer of an undoped or lightly doped high electron mobility semiconductor material directly on the surface of a substrate and an n-type conductivity doped second layer of the semiconductor material or alloy thereof on the first layer. The first layer contains any crystallographic defects which may occur because of the difference in the lattice constants of the substrate material and the semiconductor material. However, since the first layer is undoped or only lightly doped, its electron density is very low so that it is not part of the active portion of the magnetoresistor film. The second layer is doped so that it has a high electron density and a high average carrier mobility and is the active portion of the magnetoresistor film. However, since the second layer is deposited on a layer of a material having the same lattice constant, i.e., the first layer, the second layer is of good crystalline quality. Therefore, the magnetoresistor film of the present invention has improved electron mobility and good magnetoresistive characteristics.

It is to be appreciated and understood that the specific embodiments of the invention are merely illustrative of the general principles of the invention. Various modifications may be made consistent with the principles set forth. For example, although the magnetoresistor film has been described as being of indium antimonide and alloys thereof, the film can be formed of other group III-V semiconductor materials that have high electron mobilities, such as indium arsenide (InAs) and alloys thereof, such as indium gallium arsenide antimonide ($In_{1-x}Ga_xAs_{1-y}Sb_y$) or indium aluminum arsenide antimonide ($In_{1-x}Al_xAs_{1-y}Sb_y$). Also, the substrate can be made of other materials which are insulating and on which the semiconductor material of the magnetoresistor film can be readily deposited. For example, a silicon substrate having a layer of gallium arsenide epitaxially deposited thereon can be used. In addition to magnetoresistors, other magnetic field sensors can be made using the present invention. These can include Hall effect devices and hybrids between magnetoresistors and Hall effect devices.

The embodiments of the invention in which an exclusive property or privilege is claimed are defined as follows:

1. A magnetic field sensor comprising:
   a substrate having a surface; and
   an active film of a high electron mobility semiconductor material on said substrate surface, said active film comprising a first layer of the said semiconductor material which is undoped or lightly doped, and a second layer of said semiconductor material at least a portion of which is of highly doped n-type conductivity.

2. The magnetic field sensor of claim 1 in which the second layer is doped n-type completely through its thickness.

3. The magnetic field sensor of claim 2 in which the second layer has a doping concentration of between $2 \times 10^{16}$ impurities/cm$^3$ and $3 \times 10^{17}$ impurities/cm$^3$.

4. The magnetic field sensor of claim 3 in Which the second layer has a doping concentration of between $5 \times 10^{16}$ impurities/cm$^3$ and $2 \times 10^{17}$ impurities/cm$^3$.

5. The magnetic field sensor of claim 3 in which the second layer is thicker than the first layer.

6. The magnetic field sensor of claim 5 in which the film is of a thickness of no greater than 5 micrometers and the first layer is of a thickness of no greater than about 1 micrometer.

7. The magnetic field sensor of claim 6 in which the magnetoresistor film is of a thickness of between 1.5 and 3 micrometers and the first layer is of a thickness of between 0.2 and 0.4 micrometer.

8. The magnetic field sensor of claim 3 in which the semiconductor material of the magnetoresistor film is an antimonide or arsenide of indium.

9. The magnetic field sensor of claim 8 in which the substrate is of insulating gallium arsenide or indium phosphide.

10. The magnetic field sensor of claim 2 in which the concentration of the dopant in the second layer varies from substantially zero at the interface between the second layer and the first layer to a maximum at a point partially through the thickness of the second layer.

11. The magnetic field sensor of claim 1 in which the second layer comprises alternating layers of intrinsic semiconductor material and n-type conductivity semiconductor material.

12. The magnetic field sensor of claim 11 in which the n-type semiconductor layers of the second layer have a doping concentration of between $2 \times 10^{17}$ impurities/cm$^3$ and $5 \times 10^{18}$ impurities/cm$^3$.

13. The magnetic field sensor of claim 12 in which the intrinsic layers of the second layer are of a thickness of between 300 and 2000 Angstroms and the n-type layers of the second layer are of a thickness of between 20 and 100 Angstroms.

14. The magnetic field sensor of claim 13 in which the semiconductor material of the active film is an antimonide or arsenide of indium.

15. The magnetic field sensor of claim 1 in which the second layer of the active film comprises alternating layers of a group III-V semiconductor material and a ternary or quaternary alloy of the semiconductor material.

16. The magnetic field sensor of claim 15 in which the group III-V semiconductor material of the second layer is intrinsic.

17. The magnetic field sensor of claim 16 in which the ternary or quaternary alloy layer of the second layer comprises alternating layers of n-type conductivity alloy and intrinsic alloy.

18. The magnetic field sensor of claim 17 in which the n-type conductivity alloy layers have a doping density of about $2 \times 10^{17}$ impurities/cm$^3$ to $5 \times 10^{18}$ impurities/cm$^3$.

19. The magnetic field sensor of claim 18 in which each of the intrinsic group III-V semiconductor material layers is of a thickness of between 300 and 2000 Angstroms, each of the intrinsic alloy layers is of a thickness of about 20 Angstroms and each of the n-type conductivity alloy layers is of a thickness of about 50 Angstroms.

20. The magnetic field sensor of claim 19 in which the group III-V semiconductor material is indium antimonide and the ternary alloy is either indium aluminum antimonide or indium phosphide antimonide.

21. A magnetoresistor comprising:
a substrate of an insulating material having a surface;
a strip of a magnetoresistor film of a high electron mobility semiconductor material on said substrate surface, said magnetoresistor film comprising a first layer of said semiconductor material which is undoped or lightly doped on said substrate surface, and a second layer of said semiconductor material on said first layer at least a portion of which is highly doped with donor impurities so as to be of n-type conductivity;
an electrical contact on said magnetoresistor film at each end of the strip and having low contact resistance therewith; and
a plurality of shorting bars on and spaced along said magnetoresistor film strip and having low contact resistance therewith.

22. The magnetoresistor of claim 21 in which the second layer of the magnetoresistor film is doped n-type completely through its thickness.

23. The magnetoresistor of claim 22 in which the second layer has a doping concentration of between $2\times 10^{16}$ impurities/cm$^3$ and $3\times 10^{17}$ impurities/cm$^3$.

24. The magnetoresistor of claim 23 in which the second layer has a doping concentration of between $5\times 10^{16}$ impurities/cm$^3$ and $2\times 10^{17}$ impurities/cm$^3$.

25. The magnetoresistor of claim 22 in which the first layer is thinner than the second layer.

26. The magnetoresistor of claim 25 in which the magnetoresistor film is of a thickness of no greater than 5 micrometers and the first layer is of a thickness of no greater than 1 micrometer.

27. The magnetoresistor of claim 26 in which the magnetoresistor film is of a thickness of between 1.5 and 3 micrometers, and the first layer is of a thickness of between 0.2 and 0.4 micrometer.

28. The magnetoresistor of claim 23 in which the semiconductor material of the magnetoresistor film is an antimonide or arsenide of indium.

29. The magnetoresistor of claim 28 in which the substrate is of insulating gallium arsenide or indium phosphide.

30. The magnetoresistor of claim 29 in which the contacts and shorting bars are of a conductive metal or of the same semiconductor material as the magnetoresistor film but more heavily doped.

31. The magnetoresistor of claim 22 in which the concentration of the dopant in the second layer of the magnetoresistor film varies from substantially zero at the interface of the second layer and the first layer of the magnetoresistor film to a maximum at a point partially through the thickness of the second layer.

32. The magnetoresistor of claim 21 in which the second layer of the magnetoresistor film comprises alternating layers of intrinsic semiconductor material and n-type conductivity semiconductor material.

33. The magnetoresistor of claim 32 in which the n-type semiconductor layers of the second layer have a doping concentration of between $2\times 10^{17}$ impurities/cm$^3$ and $5\times 10^{18}$ impurities/cm$^3$.

34. The magnetoresistor of claim 33 in which the intrinsic layers of the second layer are of a thickness of between 300 and 2000 Angstroms and the n-type layers of the second layer are of a thickness of between 20 and 100 Angstroms.

35. The magnetoresistor of claim 34 in which the semiconductor material of the magnetoresistor film is an antimonide or arsenide of indium.

36. The magnetoresistor of claim 21 in which the second layer of the magnetoresistor film comprises alternating layers of a group III-V semiconductor material and a ternary or quaternary alloy of the semiconductor material.

37. The magnetoresistor of claim 36 in which the group III-V semiconductor material layers of the second layer are intrinsic.

38. The magnetoresistor of claim 37 in which the ternary or quaternary alloy layers of the second layer comprises alternating layers of n-type conductivity alloy and intrinsic alloy.

39. The magnetoresistor of claim 38 in which the n-type conductivity alloy layers have a doping concentration of between $2\times 10^{17}$ impurities/cm$^3$ and $5\times 10^{18}$ impurities/cm$^3$.

40. The magnetoresistor of claim 39 in which each of the intrinsic group III-V semiconductor material layers is of a thickness of between 300 and 2000 Angstroms, each of the intrinsic alloy layers is of a thickness of about 20 Angstroms and each of the n-type conductivity alloy layers is of a thickness of about 50 Angstroms.

41. The magnetoresistor of claim 39 in which the group III-V semiconductor material is indium antimonide and the alloy is either indium aluminum antimonide or indium phosphide antimonide.

42. A magnetoresistor comprising:
a substrate of an insulating semiconductor material having a surface;
a strip of a magnetoresistor film on the substrate surface, said magnetoresistor film comprising a thin first layer of substantially undoped indium antimonide on the substrate surface, and a second layer of n-type conductivity indium antimonide on the first layer, said second layer being thicker than the first layer;
an electrical contact on said magnetoresistor film at each end of the strip and having low contact resistance with the second layer of the magnetoresistor film; and
a plurality of shorting bars on and spaced along said magnetoresistor film and having low contact resistance with the second layer of the magnetoresistor film.

43. The magnetoresistor of claim 42 in which the second layer of the magnetoresistor film has a doping concentration of between $2\times 10^{16}$ impurities/cm$^3$ and $3\times 10^{17}$ impurities/cm$^3$.

44. The magnetoresistor of claim 43 in which the magnetoresistor film is of a thickness of no greater than 5 micrometers and the first layer of the magnetoresistor film is of a thickness of no greater than about 1 micrometer.

45. The magnetoresistor of claim 44 in which the first and second layers are of indium antimonide.

* * * * *